United States Patent
Shih (12)

(10) Patent No.: US 6,821,896 B1
(45) Date of Patent: Nov. 23, 2004

(54) METHOD TO ELIMINATE VIA POISON EFFECT

(75) Inventor: Tsu Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 09/867,563

(22) Filed: May 31, 2001

(51) Int. Cl.⁷ ............................................. H01L 21/302
(52) U.S. Cl. ..................... 438/692; 438/693; 438/694; 438/700
(58) Field of Search ................................ 438/692, 693, 438/694, 700, 702, 723, 724, 725

(56) References Cited

U.S. PATENT DOCUMENTS

| | | | |
|---|---|---|---|
| 5,422,309 A | | 6/1995 | Zettler et al. ............... 437/192 |
| 5,705,430 A | * | 1/1998 | Avanzino et al. ........... 438/618 |
| 5,741,626 A | | 4/1998 | Jain et al. .................. 430/314 |
| 5,821,160 A | * | 10/1998 | Rodriguez et al. .......... 438/129 |
| 5,989,353 A | * | 11/1999 | Skee et al. ...................... 134/2 |
| 6,033,977 A | | 3/2000 | Gutsche et al. ............. 438/618 |
| 6,042,999 A | * | 3/2000 | Lin et al. ..................... 430/313 |
| 6,051,369 A | | 4/2000 | Azuma et al. .............. 430/312 |
| 6,057,239 A | * | 5/2000 | Wang et al. ................. 438/689 |
| 6,309,957 B1 | * | 10/2001 | Tu et al. ...................... 438/622 |
| 6,319,809 B1 | * | 11/2001 | Chang et al. ............... 438/597 |
| 6,326,296 B1 | * | 12/2001 | Tsai et al. ................... 438/624 |

FOREIGN PATENT DOCUMENTS

| | | |
|---|---|---|
| TW | 368732 | 3/1983 |
| TW | 383460 | 2/1987 |

OTHER PUBLICATIONS

Fundamentals of Semiconductor Processing Technologies, Badih El–Kareh, 1995, Kluwer Academic publishers, pp. 547 and 565–566.*

* cited by examiner

Primary Examiner—Kin-Chan Chen
(74) Attorney, Agent, or Firm—Haynes and Boone, LLP

(57) ABSTRACT

A method is provided for forming contact/via hole openings without the detrimental volcano effect that is normally encountered in forming damascene structures. It is disclosed that the hole openings are needed to be filled with a protective material, in the first place, so as to prevent any damage to the exposed surface at the bottom of the openings. However, the filling material must be chosen properly, for otherwise, the material can leave behind a scum-like residue which then can erupt like a volcano during the subsequent process steps, which in turn can lead to functionality as well as reliability problems. It is disclosed in the present invention that when i-line photoresist (i-line PR), or, spin-on organic oxide is used as the protective filler material, the volcano effect can be avoided, and a Cu dual damascene interconnect with low RC delay characteristics can be obtained.

21 Claims, 5 Drawing Sheets

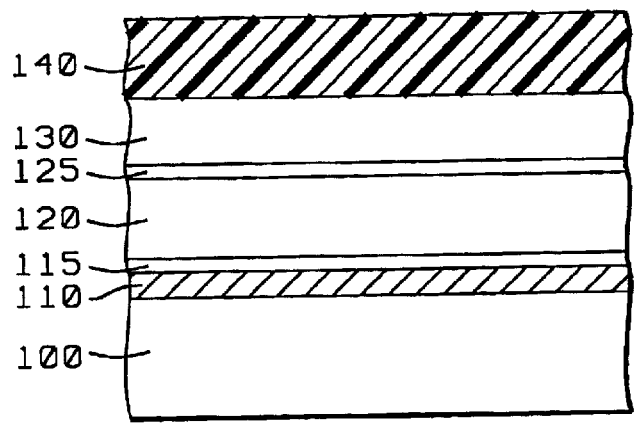
FIG. 1a – Prior Art
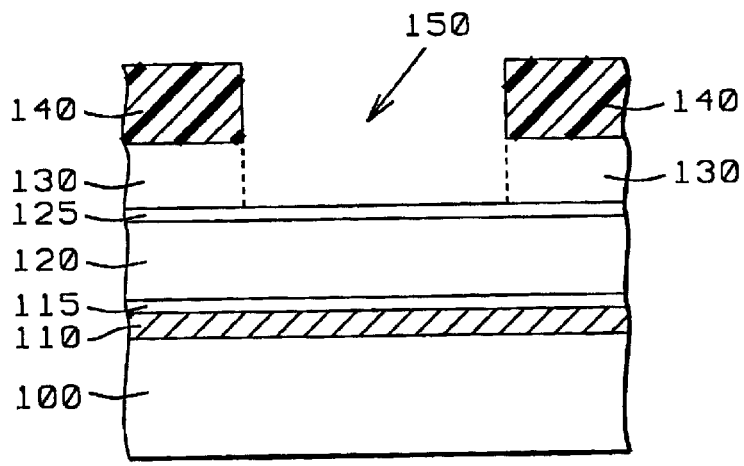
FIG. 1b – Prior Art
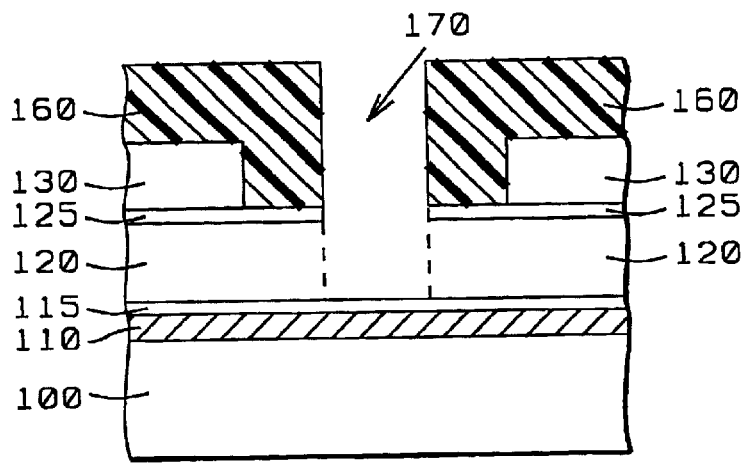
FIG. 1c – Prior Art

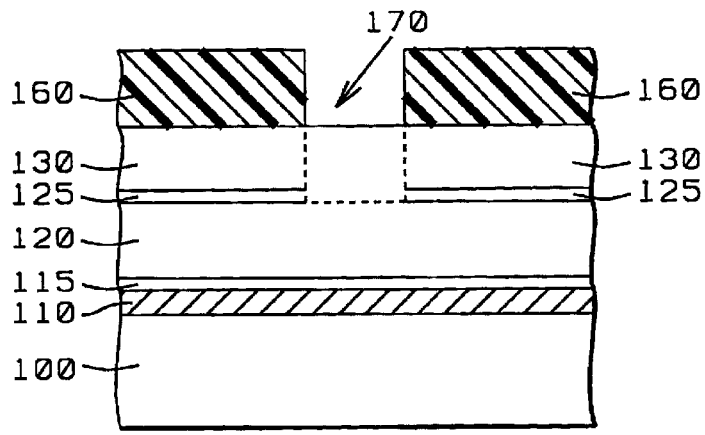
*FIG. 1d - Prior Art*
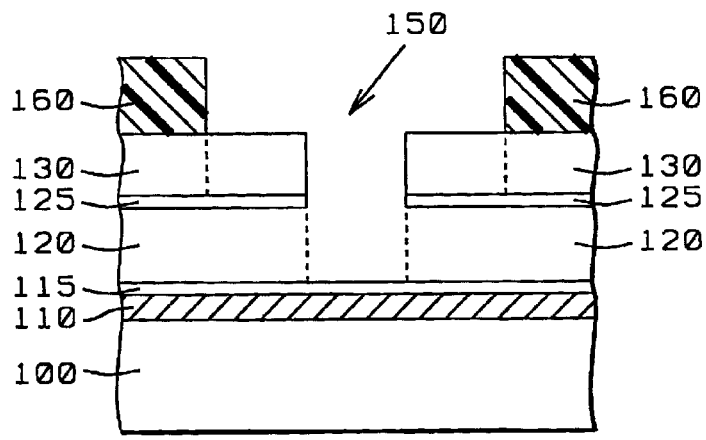
*FIG. 1e - Prior Art*
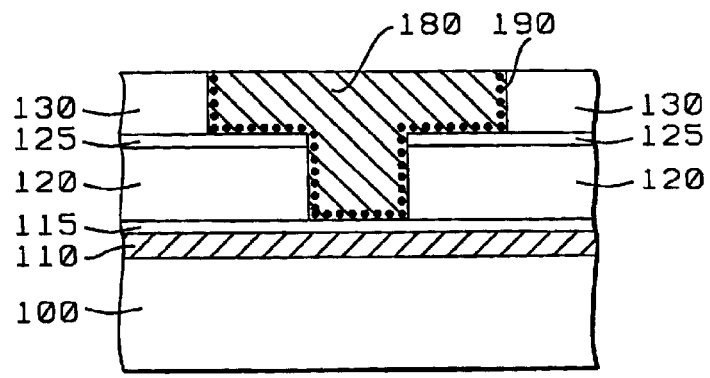
*FIG. 1f - Prior Art*

METHOD TO ELIMINATE VIA POISON EFFECT

BACKGROUND OF THE INVENTION (1) Field of the Invention

The present invention relates to the manufacture of semiconductor devices in general, and in particular, to a method of preventing via poisoning and the attendant "volcano" effect which can cause reliability as well functionality problems especially with sub-micron technologies.

(2) Description of the Related Art

Poisoned vias and the attendant "volcano"-like eruptions that occur at interconnections between metal layers in semiconductor devices are becoming more and more evident with newer metals, such as copper, and newer dielectrics, such as low-k dielectrics, that are gaining more use in the low sub-micron technologies of to-day. It is disclosed later in the embodiments of the present invention a method of forming interconnects, such as the damascene interconnect, without having the via poison effect.

With the advent of ultra large scale integrated (ULSI) circuit technology, the number of interconnections required between millions of transistors have increased astronomically, as is well known to the practitioners in the art. These interconnections, in the form of metal lines, are usually are of very fine geometries and are closely spaced with respect to each other in order to conserve "real estate" in the chip on which they are formed. The planar area of the chip is further conserved by forming multi-level metallized layers separated from each other by insulative layers. The close spacing between the lines, both horizontally on the same layer, and vertically between layers, can cause higher electrical interference and cross-talk between the lines, and hence high resistance-capacitance (RC) delay for the circuitry. As the device geometries shrink further to deep submicron geometries such as 0.15 micrometers ($\mu$m), the RC delay becomes even more significant.

In order to decrease the RC delay, or, time constant, within these multi-level integrated systems, low-k (dielectric constant) insulative materials are used. Conventional semiconductor fabrication methods use silicon dioxide or similar insulative materials as both gap filler between adjacent conductor lines on the same layer and as an interlayer insulator between different layers of interconnections. However, low-k materials give rise to via poison effect during the process of manufacturing interconnects, especially copper dual damascene interconnects. The present invention discloses a method of preventing such poison effects in "vias" formed between metal layers as well as in "contacts" that are formed between the devices in the semiconductor substrate and the first level metal, as is known in the art.

Cu dual damascene is preferred as an interconnect because, as is well known in the art, copper has lower resistivity than the commonly used aluminum and, therefore contributes to lower RC delay. The damascene process also provides a better control of the metal line geometries, as described below, and therefore improves further the RC characteristics of the lines. However, if the damascene structure is not properly protected during forming of the contact and via holes, the holes can be "poisoned" due to outgassing from the insulative layers, and/or due to the hydrophobic nature of the insulative layers. A poisoned contact hole (reaching the substrate), or a poisoned via hole (connecting different metallized layers) can give rise to voids, cavities for contaminants to enter, poor interfaces between contacting conductors, and, hence, poor connections between interconnects. It is disclosed later in the embodiments of the present invention a method of protecting dual damascene structures in order to avoid via poisoning problem and the attendant poison effect.

In one approach for a dual damascene process shown in FIG. 1a, two insulative layers (120) and (130) are formed on a substrate (100) with an intervening etch-stop layer (125). Substrate (100) is provided with metal layer (110) and a barrier layer (115). Metal layer can be the commonly used aluminum or copper, while the barrier can be an oxide layer. A desired trench or trench pattern (150) is first etched into the upper insulative material (130) using conventional photolithographic methods and photoresist (140). The etching stops on etch-stop layer (125). Next, a second photoresist layer (160) is formed over the substrate, thus filling the trench opening (150), and patterned with hole opening (170), as shown in FIG. 1b. The hole pattern is then etched into the lower insulative layer (120) as shown in FIG. 1c and photoresist removed, thus forming the dual damascene structure shown in FIG. 1f.

Or, the order in which the trench and the hole are formed can be reversed. Thus, the upper insulative layer (130) is first etched, or patterned, with hole (170), as shown in FIG. 1d. The hole pattern is also formed into etch-stop layer (125). Then, the upper layer is etched to form trench (150) while at the same time the etching transfers the hole pattern in the etch-stop layer into lower insulation layer (120), as shown in FIG. 1e. It will be noted that the etch-stop layer stops the etching of the trench into the lower insulation layer. After the completion of the thusly formed dual damascene structure, both the hole opening and trench opening are filled with metal (180), and any excess material on the surface of the substrate is removed by chemical mechanical polishing, as seen in FIG. 1f.

However, when trench (150), or hole (170) openings are formed through the insulative layers (120) and (130) as shown in FIGS. 1b–1e, moisture (190) is absorbed from the atmosphere by the exposed dielectric layers on the sidewalls of the openings. After copper (180) is deposited, moisture (190) is then released from the dielectric layers. This moisture diffuses into the metal causing poisoned via/contact metallurgy.

Other forms of via poisoning and the attendant volcano effect can also occur during the processing of vias and contacts in semiconductor manufacturing, especially when interconnect holes are filled with photoresist in an attempt to protect the holes from damage during subsequent process steps. A dual damascene with a sacrificial fill is described in U.S. Pat. No. 5,705,430 by Avanzino, et al. A first layer of insulating material is formed with via openings. The openings arc filled with a sacrificial removable material. A second layer of insulating material is deposed on the first layer. In one embodiment, the etch selectivity to the etchant of the second layer is essentially the same as the sacrificial via fill and, preferably, is substantially higher than second layer. Using a conductive line pattern aligned with the via openings conductive line openings are etched in the second insulating layer and, during etching, the sacrificial fill is removed from the via openings. In a second embodiment. The sacrificial material is not etchable by the etchant for forming the conductive line openings and, after formation of the conductive line openings, the sacrificial material is removed with an etchant to which the first insulating layer is resistive or less selective. A conductive material now is deposited in die conductive line and via openings. If, however, the sacrificial fill is a photoresist, where the photoresist can be removed by any number of methods including oxygen plasma ashing, then the residues found in the via holes can cause volcano-like eruptions in later process steps. Another method of forming a dual damascene structure using a sacrificial stud in the via hole is shown in U.S. Pat. No. 6,033,977 by Gutsche, et al. However, in this case, the sacrificial material is selected from the group consisting of flowable oxide, CVD oxide and boron silicate glass.

Another method for producing a metallization level having contact and interconnect connecting the contacts is taught by Zettler, et al., in U.S. Pat. No. 5,422,309. An insulating layer wherein contact holes to regions to be contacted are opened is applied surface-wide onto a substrate. For producing an interconnect mask, a photoresist layer is applied, exposed and developed such that the surface of the regions to be contacted remains covered with photoresist in exposed regions, whereas the surface of the insulating layer is uncovered in the exposed regions. Using the interconnect mask as etching mask, trenches are etched into the insulating layer. Contacts and interconnects of a metallization level are finished by filling the contact holes and the trenches with metal.

Azuma in U.S. Pat. No. 6,051,369 discloses a method of forming a dual damascene using one or more antireflective coating films. A film is formed on the antireflective film and a radiation sensitive film is formed on the film. The radiation sensitive film is selectively exposed. During the selective exposing, the antireflective film covers the lower surface of the portion of film on which the radiation sensitive film is formed, and the antireflective coating film reduces reflections of radiation during the selective exposing of the radiation sensitive film. A fabrication process using the lithography process is also described.

In still another U.S. Pat. No. 5,741,626, Jain, et al., cite the forming of a dual damascene using a particular etch process. The method provides an anti-reflective $Ta_3N_5$ coating which is used in a dual damascene structure and for I line or G line lithographies. In addition, the $Ta_3N_5$ coating may also used as an etch stop and a barrier layer. A dual damascene structure is formed by depositing a first dielectric layer. A dielectric tantalum nitride layer is deposited on top of the first dielectric layer. A second dielectric layer is deposited on the tantalum nitride layer. A dual damascene opening is etched into the dielectric layers by patterning a first opening portion and a second opening portion using photolithography operations. Dielectric tantalum nitride layer serves as an ARC layer during these operations to reduce the amount of reflectance from conductive region to reduce distortion of the photoresist pattern. The use of a dielectric tantalum nitride layer as an ARC is shown particularly for i-line and g-line lithography.

As i-line or g-line lithographies are getting to be more prevalent in applications such as dual damascene, there is a need for improved methods to protect contact/via holes from experiencing poison effects.

SUMMARY OF THE INVENTION

It is therefore an object of this invention to provide a method of eliminating poison effect in forming contact/via hole openings in dual damascene structures.

It is another object of the present invention to provide a method of eliminating poison effect by filling contact/via holes with i-line photoresist (i-line PR) which does not leave a scum-like residue that would, otherwise, erupt like a volcano in later process steps.

It is yet another object of the present invention to provide a method of reducing the RC delay of Cu dual damascene interconnects through prevention of poison effect in the damascene structure.

These objects are accomplished by providing a substrate having a passivation layer formed over a first metal layer formed on said substrate; forming a first insulative layer over said substrate; forming an optional etch-stop layer over said first insulative layer; forming a second insulative layer over said etch-stop layer; forming a first photoresist layer over said second insulative layer and patterning said photoresist to form a first photoresist mask having a hole pattern; etching said first and second insulative layers, including said optional etch-stop layer through said hole pattern to form a hole reaching said passivation layer; removing said first photoresist mask; forming a fill material over said substrate, including in said hole opening; removing any excess fill material over said hole opening; forming a second photoresist layer over said substrate, including said hole opening and patterning said second photoresist to form a second photoresist mask having a trench pattern; etching said second insulative layer through said trench pattern in said second photoresist mask to form a trench in said second insulative layer, thus completing the forming of said dual damascene structure in said substrate; removing said second photoresist mask; removing said fill material from said hole opening; depositing a second metal in said dual damascene structure; and removing excess metal to complete the forming of said dual damascene without the poison effect. These objects are further accomplished by using as fill material for this application, i-line photoresist (PR), or spin-on organic oxides, such as SiLK or FLARE.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene interconnect formed by either one of the methods shown in FIGS. 1a–1c or FIGS. 1d–1e, according to prior art.

DESCRIPTION OF THE PREFERRED EMBODIMENTS

It is disclosed in the embodiments of the present invention a method of avoiding poison effect in contact and via holes by using an appropriate photoresist that will not leave residues or "scum" at the bottom of damascene structures. Specifically, it is disclosed that by using an i-line lithography photoresist (i-line PR), or, spin-on oxide (e.g., SILK, FLARE, SOG) instead of the commonly used deep ultraviolet lithography photoresist (DUV PR) in protecting contact/via holes during the various process steps, the problem of residue in the holes and the attendant problem of volcano like eruptions are alleviated.

Figure 2A:
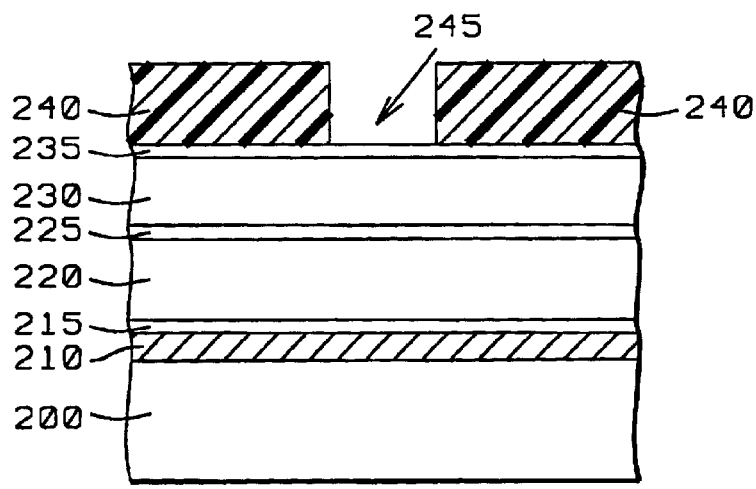
FIG. 2a is a partial cross-sectional view of a substrate showing the forming of a first photoresist mask over a passivation layer covering two underlying insulative layers separated from each other with an intervening etch-stop layer, according to the present invention.

Referring now to the drawings, FIG. 2a shows a portion of a semiconductor substrate (200), which is preferably silicon. In FIG. 2a, the substrate is provided with a metal layer (210) and a passivation layer (215). Metal is preferably copper with a thickness between about 1500 to 10000 Å, and the passivation layer comprises oxide, nitride, carbide with a thickness between about 100 to 1000 Å. It will be noted, however, that the presently disclosed method is applicable to forming a dual damascene interconnect to connect to either the substrate, that is, to form a contact, as is known in the art, or to connect to an underlying metal layer, to form a via. In other words, the method can be employed for forming either damascene contacts or vias.

First dielectric layer (220) is formed over the passivation layer, comprising a material of low dielectric constant (low-k). Some of the conventional low-k materials are usually fluorinated, such as the amorphous fluorinated carbon ($\alpha$-C:F), poly-tetra-fluoro-ethylene (PTFE), fluorinated polyimide, fluorinated or $SiO_2$, phosphosilicate glass (PSG). However, defluoriniation occurs with these materials, which then reacts with barrier materials and causes delamination. Barrier materials are used because, copper unfortunately suffers from high diffusivity in these insulating materials. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. Also, although these materials have relatively low dielectric constants of less than 4.0, it is preferred that even lower k materials, such as black diamond, having dielectric constants between about 2.2 to 3.5 be used. It is preferred that the first dielectric layer is formed by CVD or spinning on to a thickness between about 1000 to 10000 Å.

Next, an etch-stop, layer (225) shown in FIG. 2a may be optionally formed over the first dielectric layer, but is not necessary. This is followed by the forming of second dielectric layer (230), which is also a low-k material chemical vapor deposited or spun on to a thickness between about 1000 to 10000 Å. A second passivation layer (135), same as the first passivation layer (115) as shown in FIG. 2a may also be formed over the second dielectric layer, but is not necessarily required.

Figure 2B:
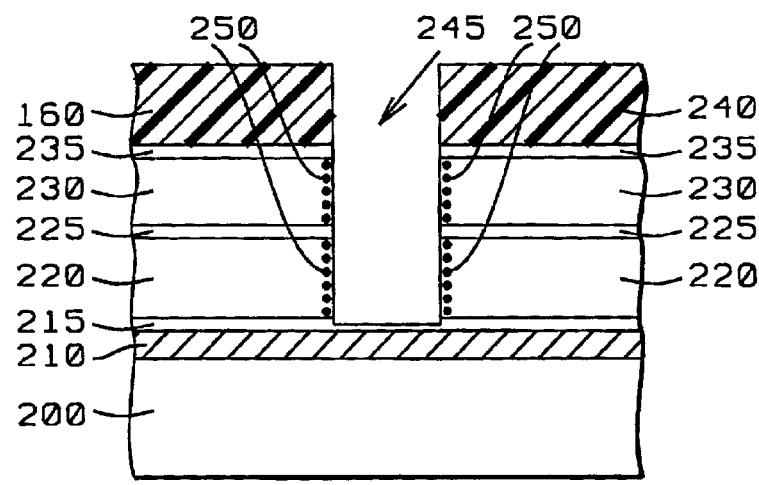
FIG. 2b is a partial cross-sectional view of a substrate showing the forming of a hole opening into the two insulative layers of FIG. 2a, according to the present invention.

Using conventional techniques, first photoresist layer (240) is next formed over the second insulative dielectric layer and then patterned to form a first photoresist mask with the image of a conventional via or a contact hole. Using the photoresist layer as a mask, hole pattern (245) is then etched into the second and first dielectric layers, in that order, including the intervening etch-stop layer (225) as shown in FIG. 2b. After the etching, the photoresist mask is removed, preferably by oxygen plasma ashing.

Figure 2C:
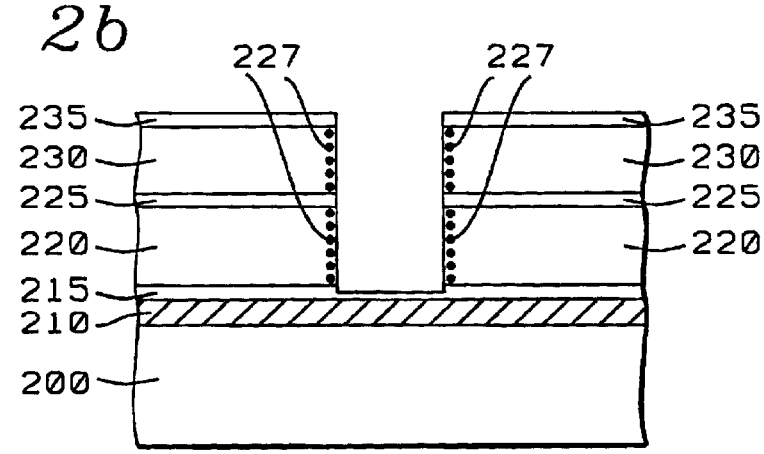
FIG. 2c is a partial cross-sectional view of a substrate showing moisture absorption on the sidewalls of the hole opening of FIG. 2b after etching, according to the present invention.

As it will be appreciated by those skilled in the art, etching process introduces moisture, to the insulative layers (220) and (230) comprising the inside walls of the opening (245), as depicted by reference numeral, (227) in FIG. 2c, where first photoresist mask (240) has been removed after etching. This moisture then diffuses into the metal deposited in the opening at a later step. In other words, if not properly protected, the hole openings can be "poisoned" due to outgassing from the insulative layers during the subsequent step of metal deposition, and/or due to the hydrophobic nature of the insulative layers. A poisoned contact hole (reaching the substrate), or a poisoned via hole (connecting another metallized layer) can give rise to voids, cavities for contaminants to enter, poor interfaces between contacting conductors, and, hence, poor connections between interconnects. Also, it is found that low-k materials are susceptible to form interactions with photoresist material, and hence etching can leave behind photoresist residue, which are detrimental in forming poisoned contact/via holes.

Figure 2D:
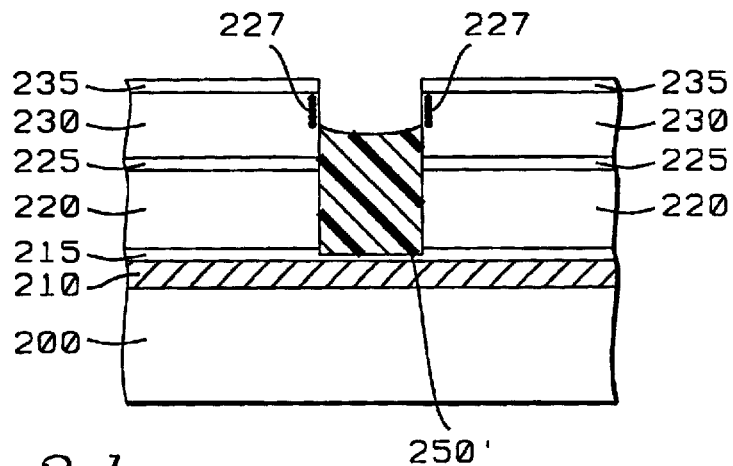
FIG. 2d is a partial cross-sectional view of a substrate showing an incomplete fill of the hole opening of FIG. 2c, according to prior art.

It is therefore, important that the hole opening is completely filled with a material that will prevent any reaction that would lead to a poisoned via. It is the current practice in the present manufacturing line that the hole opening is filled with a photoresist that is suitable for deep ultraviolet radiation (DUV-PR) that is used for patterning semiconductor features. However, it is found that a DUV-PR deposited only into a hole opening reacts with the surrounding dielectric material, especially with low-k dielectric materials. The situation is exacerbated if filler material (250') does not fully fill the hole opening, as shown in FIG. 2d. As a result, when the DUV-PR is removed at a later step, it leaves behind a scum-like residue, which in turn causes an eruption due to the volcano effect during further processing. It is a main feature and key aspect of the present invention, therefore, to fill the hole opening with a material that will not only protect the via from poisoning, but also from volcano effect. It is disclosed hereby that the proper fill material is a specific photoresist, namely, i-line photoresist (i-line PR), or, a spin-on organic oxide such as SiLK and FLARE. An added advantage of using the i-line photoresist is that it is more suitable, in comparison with DUV-PR, for higher wave length radiation that is needed for patterning deep submicron features of today's ULSI technology.

Figure 2E:
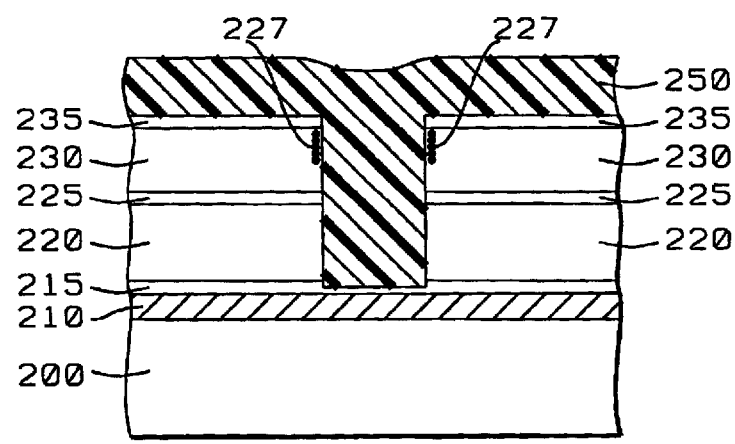
FIG. 2e is a partial cross-sectional view of a substrate showing a complete fill of the hole opening of FIG. 2c with i-line photoresist (i-line PR), or spin-on oxide (e.g., Silk, Flare, SOG) according to the present invention.
Figure 2F:
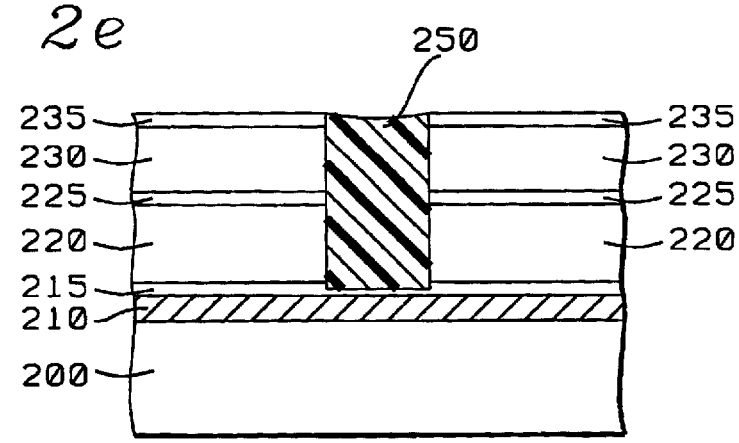
FIG. 2f is a partial cross-sectional view of a substrate showing the removal of the excess i-line PR of FIG. 2e, according to the present invention.

Thus, it is important that the fill material fills the hole opening completely so that the sidewalls are not left unprotected during subsequent processing. Thus, i-line PR, or, spin-on organic oxide (250) is formed over the substrate, including the hole opening, as shown in FIG. 2e, and any excess is removed and planarized with respect to the surface of the substrate using chemical-mechanical polishing (CMP), or by etching, as shown in FIG. 2f.

Figure 2G:
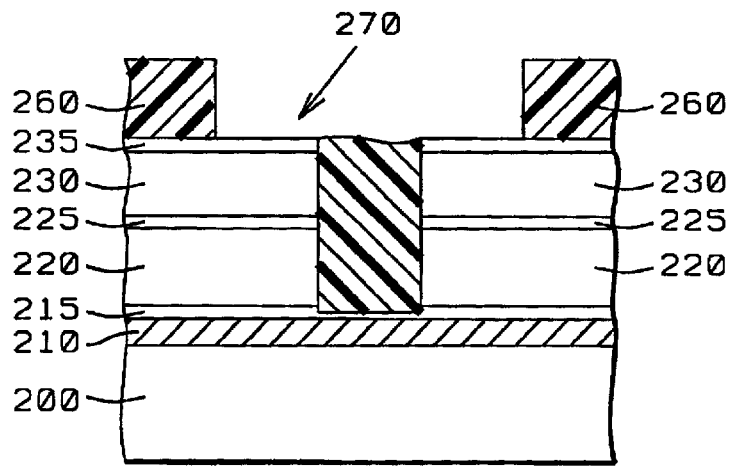
FIG. 2g is a partial cross-sectional view of a substrate showing the forming of a second photoresist mask having a line trench pattern, according to the present invention.
Figure 2H:
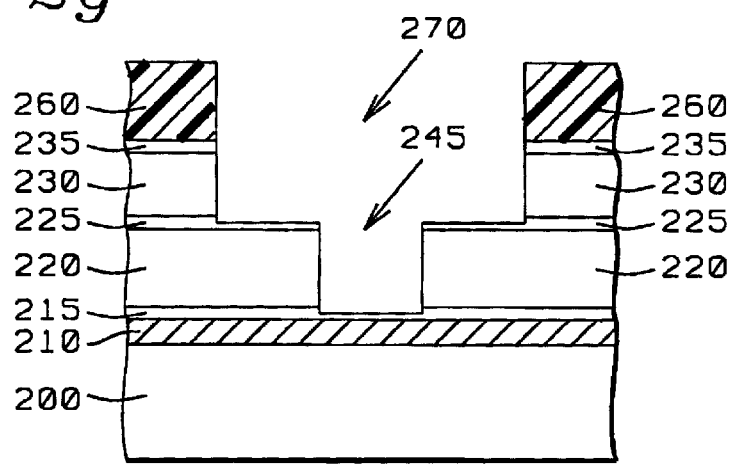
FIG. 2h is a partial cross-sectional view of a substrate showing the transferring of the trench pattern of FIG. 2g into the second insulative layer, according to the present invention.

Next, second photoresist layer (260) is formed over the substrate, including the opening formed in the previous step, and patterned with the image of a line trench to form a second photoresist mask with a groove (270) as shown in FIG. 2g. The second photoresist comprises DUV-PR which is used for metal patterning. The line pat tern is next transferred from the second photoresist mask into the second dielectric layer by etching and stopping on optional etch-stop layer (225). After removal of the second photoresist layer, a damascene structure having a composite hole (245) and line (275) pattern is thus formed as shown in FIG. 2h.

Figure 2I:
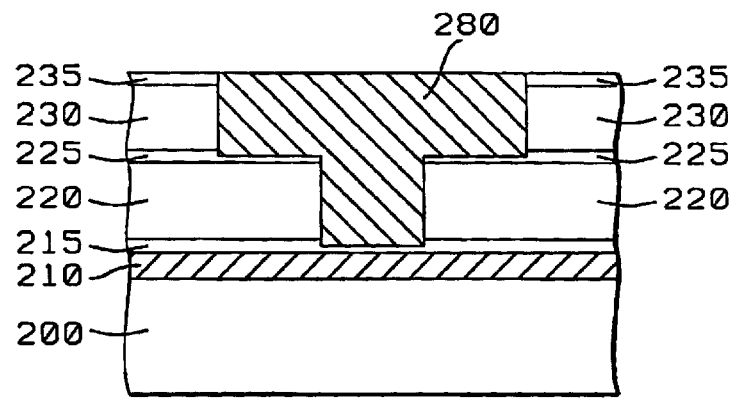
FIG. 2i is a partial cross-sectional view of a substrate showing the completion of the copper dual damascene interconnect of the present invention.

As a penultimate step, copper metal (280) is deposited in the dual damascene structure shown in FIG. 2i to a thickness between about 1000 to 15000 angstroms (Å). Subsequently, excess metal is removed by any number of conventional techniques, including chemical-mechanical polishing (CMP).

Thus, a Cu dual damascene interconnect is formed devoid of poisoned vias and/or contacts as well as volcano effect. Though various details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite. For example, though the method of avoiding volcano effect is shown in application to a dual damascene structure, the same method can be employed in the case of a single damascene, or in the case of contact/via hole openings formed using other conventional methods.

While the invention has been particularly shown and described with reference to the preferred embodiments thereof, it will be understood by those skilled in the art that various changes in form and details may be made without departing from the spirit and scope of the invention.

What is claimed is:

1. A method of eliminating volcano effect in dual damascene comprisng the steps of:
   providing a substrate having first and second insulative layers, optionally separated from each other by an intervening etch-stop layer formed thereon said substrate;
   forming a hole opening through said first and second insue layers;
   forming a fill material over said substrate, including in said hole opening, wherein said fill material comprises I-line photoresist;
   removing any excess fill material over said hole opening, wherein said removing said any excess fill material is accomplished by chemical mechanical polishing or by etching;
   forming a trench opening in said second insulative layer over said hole opening in said first insulative layer, thus completing the forming of said dual damascene structure on said substrate;
   removing said fill material from said hole opening;
   deposiing metal in said dual damasoene structure; and
   removing excess metal to complete the forming of said dual damascene without the volcano effect.

2. The method of claim 1, wherein said substrate is silicon.

3. The method of claim 1, wherein said first insulative layer is a low-k dielectic having a dielectric constant between about 2.2 to 3.5.

4. The method of claim 1, wherein said first insulative layer has a thickness between about 1000 to 10000 A.

5. The method of claim 1, wherein said optional intervening etch-stop layer is silicon nitride.

6. The method of claim 1, wherein said second insulative layer is a low-k dielectric having a dielectric constant between about 2.2 to 3.5.

7. The method of claim 1, wherein said second insulative layer has a thickness between about 1000 to 10000 A.

8. The method of claim 1, wherein said metal comprises copper.

9. The method of claim 1, wherein said metal has a thickness between about 1000 to 15000 A.

10. The method of claim 1, wherein said removing said excess metal is accomplished by chemical mechanical polishing.

11. A method of eliminating volcano effect in dual damascene comprising the steps of:
   providing a substrate having a passivation layer formed over a first metal layer formed an said substrate;
   forming a first insulative layer over said substrate;
   forming an optional etch-stop layer over said first insulative layer;
   forming a second insulative layer over said etch-stop layer;
   forming a first photoresist layer over said second insulative layer and patterning said photoresist to form a first photoresist mask having a hole pattern;
   etching said first and second insulative layers, including said optional etch-stop layer through said hole pattern to form a hole reaching said passivation layer;
   removing said first photoresist mask;
   forming a fill material over said substrate, including in said hole opening, wherein said fill material comprises I-line photoresist;
   removing any excess fill material over said hole opening, wherein said removing is accomplished by chemical mechanical polishing;
   forming a second photoresist layer over said substrate, including said hole opening and patterning said second photoresist to form a second photoresist mask having a trench pattern;
   etching said second insulative layer through said trench pattern in said second photoresist mask to form a trench in said second insulative layer, thus completing the forming of said dual damascene structure in said substrate;
   removing said second photoresist mask;
   removing said fill material from said hole opening;
   depositing a second metal in said dual damascene structure; and
   removing excess metal to complete the forming of said dual damascene without the volcano effect.

12. The method of claim 11, wherein said substrate is silicon.

13. The method of claim 11, wherein said first metal is copper.

14. The method of claim 11, wherein said first insulative layer is a low-k dielectic having a dielectric constant between about 2.2 to 3.5.

15. The method of claim 11, wherein said first insulative layer has a thickness between about 1000 to 10000 A.

16. The method of claim 11, wherein said optional etch-stop layer is silicon nitride.

17. The method of claim 11, wherein said second insulative layer is a low-k dielectric having a dielectric constant between about 2.2 to 3.5.

18. The method of claim 11, wherein said second insulative layer has a thickness between about 1000 to 10000 Å.

19. The method of claim 11, wherein said second metal comprises copper.

20. The method of claim 11, wherein said second metal has a thickness between about 1000 to 15000 Å.

21. The method of claim 11, wherein said removing said excess metal is accomplished by chemical mechanical polishing.

* * * * *